United States Patent [19]
Flamm et al.

[11] Patent Number: 5,711,849
[45] Date of Patent: Jan. 27, 1998

[54] PROCESS OPTIMIZATION IN GAS PHASE DRY ETCHING

[75] Inventors: Daniel L. Flamm, 476 Green View Dr., Walnut Creek, Calif. 94596; John P. Verboncoeur, Hayward, Calif.

[73] Assignee: Daniel L. Flamm, Walnut Creek, Calif.

[21] Appl. No.: 433,623

[22] Filed: May 3, 1995

[51] Int. Cl.$^6$ .................................................. H01L 21/3065
[52] U.S. Cl. ........................... 156/643.1; 156/625.1; 156/346 P; 156/626.1; 156/659.11; 156/646.1; 204/298.31; 204/298.32; 216/58; 216/59
[58] Field of Search ................... 204/298.31, 298.32; 216/39, 58, 74, 79, 246 P, 625.1, 643.1, 626.1, 646.1, 659.1, 662.1, 659.11

[56] References Cited

U.S. PATENT DOCUMENTS

| | | | |
|---|---|---|---|
| 4,192,706 | 3/1980 | Horiike | 156/643.1 |
| 4,226,665 | 10/1980 | Mogab | 156/643.1 |
| 4,243,506 | 1/1981 | Ikeda et al. | 156/345 P |
| 4,297,162 | 10/1981 | Mundt et al. | 156/345 P |
| 4,340,461 | 7/1982 | Hendricks et al. | 156/345 P |
| 5,147,520 | 9/1992 | Bobbio | 204/298.32 |
| 5,330,606 | 7/1994 | Kubota et al. | 156/345 P |
| 5,399,229 | 3/1995 | Stefani et al. | 156/626.1 |
| 5,445,709 | 8/1995 | Kojima et al. | 156/622.1 |

OTHER PUBLICATIONS

Bird et al., *Transport Phenomena*, 1960, John Wiley & Sons, p. 510.

Manos, D. M. and Flamm, D. L., *Plasma Etchings, An Introduction*, 1989, Academic Press, (title page and table of contents only).

Thompson et al. "Introduction to Microlithography" © 1983 ACS pp. 228–235.

Giapis et al. Appl. Phys Lett 57(10) 983–985 (Sep. 1990).

Gregus et al. Plasma Chem. Plasma Process. 13(3) 521–537 (1993).

Babanov et al. Plasma Chem. Plasma Process. 13(1) 37–59 (1993).

Ha et al. Plasma Chem. Plasma Process. 11(2) 311–321 (1991).

Rayn et al. Plasma Chem. Plasma Process. 10(2) 207–229 (1990).

Elliott "Integrated Circuit Fabrication Technology" © 1982 pp. 242–243 and 258–271.

Manos et al. "Plasma Etching, An Introduction", © 1989, Academic Press, pp. 91–183.

*Primary Examiner*—Martin Angebranndt
*Attorney, Agent, or Firm*—Townsend and Townsend and Crew LLP

[57] ABSTRACT

A method of designing a reactor 10. The present reactor design method includes steps of providing a first plasma etching apparatus 10 having a substrate 21 therein. The substrate includes a top surface and a film overlying the top surface, and the film having a top film surface. The present reactor design method also includes chemical etching the top film surface to define a profile 27 on the film, and defining etch rate data from the profile region. A step of extracting a reaction rate constant from the etch rate data, and a step of using the reaction rate constant in designing a second plasma etching apparatus is also included.

29 Claims, 8 Drawing Sheets

PROCESS OPTIMIZATION IN GAS PHASE DRY ETCHING

BACKGROUND OF THE INVENTION

The present invention relates to integrated circuits and their manufacture. The present invention is illustrated in an example with regard to plasma etching, and more particularly to plasma etching in resist strippers in semiconductor processing. But it will be recognized that the invention has a wider range of applicability in other technologies such as flat panel displays, large area substrate processing, and the like. Merely by way of example, the invention may be applied in plasma etching of materials such as silicon, silicon dioxide, silicon nitride, polysilicon, photoresist, polyimide, tungsten, among others.

Industry utilizes or has proposed several techniques for plasma etching. One such method is conventional chemical gas phase dry etching. Conventional chemical gas phase dry etching relies upon a reaction between a neutral gas phase species and a surface material layer, typically for removal. The reaction generally forms volatile products with the surface material layer for its removal. In such method, the neutral gas phase species may be formed by way of a plasma discharge.

A limitation with the conventional plasma etching technique is obtaining and maintaining etching uniformity within selected predetermined limits. In fact, the conventional technique for obtaining and maintaining uniform etching relies upon a "trial and error" process. The trial and error process often cannot anticipate the effects of parameter changes for actual wafer production. Accordingly, the conventional technique for obtaining and maintaining etching uniformity is often costly, laborious, and difficult to achieve.

Another limitation with the conventional plasma etching technique is reaction rates between the etching species and the etched material are often not available. Accordingly, it is often impossible to anticipate actual etch rates from reaction rate constants since no accurate reaction rate constants are available. In fact, conventional techniques require the actual construction and operation of an etching apparatus to obtain accurate etch rates. Full scale prototype equipment and the use of actual semiconductor wafers are often required, thereby being an expensive and time consuming process.

From the above it is seen that a method and apparatus of etching semiconductor wafers that is easy, reliable, faster, predictable, and cost effective is often desired.

SUMMARY OF THE INVENTION

According to the present invention, a plasma etching method that includes determining a reaction rate coefficient based upon etch profile data is provided. The present plasma etching method provides for an easy and cost effective way to select appropriate etching parameters such as reactor dimensions, temperature, pressure, radio frequency (rf) power, flow rate and the like by way of the etch profile data.

In a specific embodiment, the present invention provides an integrated circuit fabrication method. The present method includes steps of providing a plasma etching apparatus having a substrate therein. The substrate includes a top surface and a film overlying the top surface. The film includes a top film surface. The present method also includes chemically etching the top film surface to define an etching profile on the film, and defining etch rate data which includes an etch rate and a spatial coordinate from the etching profile. A step of extracting a reaction rate constant from the etch rate data, and using the reaction rate constant in adjusting a plasma etching apparatus is also included.

In an alternative specific embodiment, the present invention also provides a method of designing a reactor. The present method includes providing a first plasma etching apparatus having a substrate therein. The substrate has a top surface and a film overlying the top surface. The film has a top film surface. The present method also includes chemically etching the top film surface to define an etching profile on the film, and defining etch rate data which has an etch rate and a spatial coordinate from the etching profile. A step of extracting a reaction rate constant from the etch rate data, and using the reaction rate constant in designing a second plasma etching apparatus is also included.

A further alternative embodiment provides another method of fabricating an integrated circuit device. The present method includes steps of providing a uniformity value for an etching reaction. The etching reaction includes a substrate and etchant species. The present method also includes defining etching parameter ranges providing the uniformity value. A step of adjusting at least one of the etching parameters to produce a selected etching rate is also included. The etching rate provides an etching condition for fabrication of an integrated circuit device.

The present invention achieves these benefits in the context of known process technology. However, a further understanding of the nature and advantages of the present invention may be realized by reference to the latter portions of the specification and attached drawings.

DESCRIPTION OF THE SPECIFIC EMBODIMENT

Plasma Etching Apparatus

Figure 1:
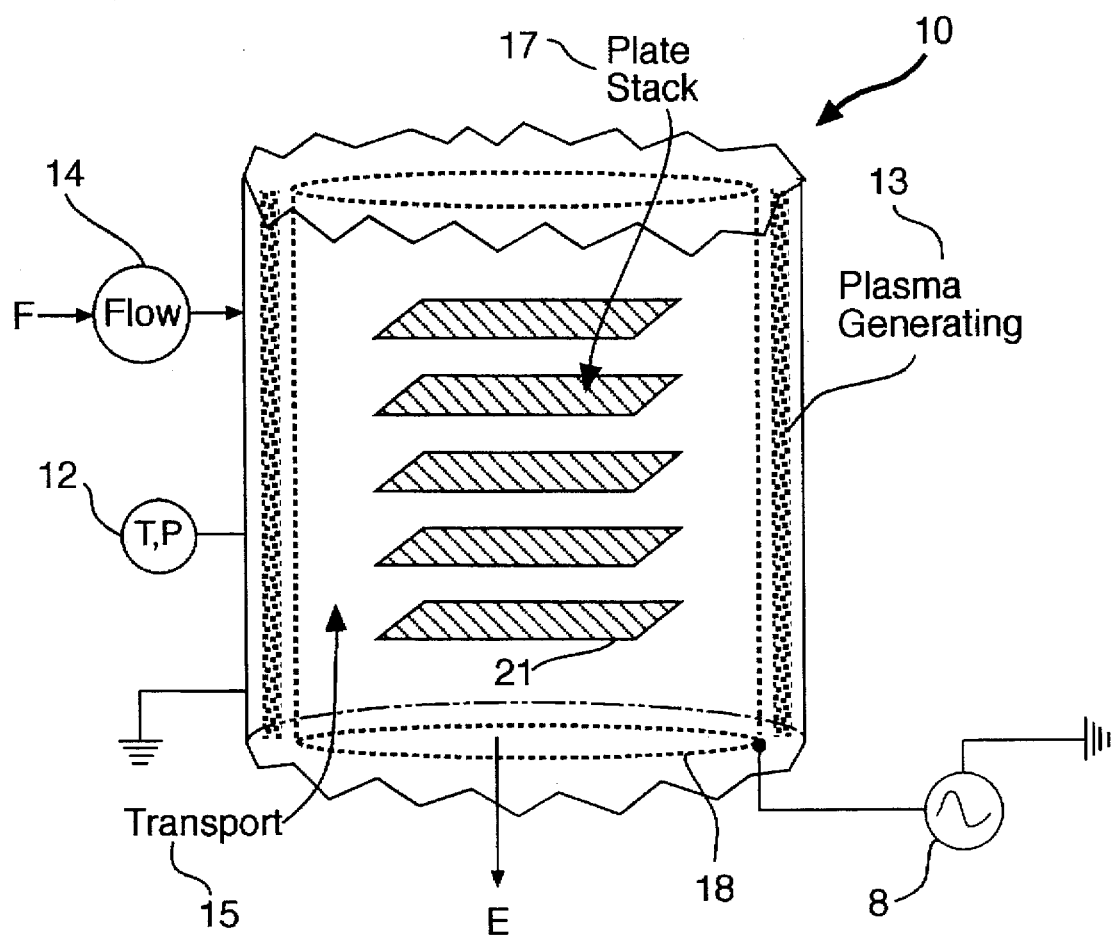
FIG. 1 is a simplified diagram of a plasma etching apparatus according to the present invention.

FIG. 1 is a simplified diagram of a plasma etching apparatus 10 according to the present invention. The plasma etching apparatus also known as a co-axial reactor includes at least three processing zones. The three processing zones are defined as a plasma generating zone (PG) 13, a transport zone (TZ) 15, a plate stack zone (PS) 17, and others. Also shown are a chemical feed F and exhaust E. The plasma generating zone provides for reactant species in plasma form and others. Excitation is often derived from a 13.56 MHz rf discharge 8 and may use either capacitor plates or a wrapped coil, but can also be derived from other sources. The co-axial reactor 10 also includes a chemical controller 14 and a temperature and pressure control 12, among other features.

Chemical effects are often enhanced over ion induced effects and other effects by way of perforated metal shields 18 to confine the discharge to a region between an outer wall 16 and shields 18. The co-axial reactor relies substantially upon diffusion to obtain the desired etching uniformity. The co-axial reactor also relies upon a chemical etch rate which is diffusion limited. In particular, the chemical etch rate is generally defined as a chemical reaction rate of etchant species plus at least a diffusion rate of etchant species. When the diffusion rate of etchant species is much greater than the chemical reaction rate, the chemical etch rate is often determined by the diffusion rate. A more detailed analysis of such chemical etch rate will be described by way of the subsequent embodiments.

Etchant species from the plasma generating zone diffuse through the transport zone 15 of the reaction chamber, and enter the plate stack zone space over surfaces of substrates 21. A concentration of etchant in the transport zone, which is often annular, between the plasma generating zone and the plate stack zone is defined as $n_{oO}$. As etchant diffuses radially from the transport zone into the plate stack zone and over surfaces of the substrates, it is consumed by an etching reaction. A reactant concentration above the substrate can be defined as $n_o(r,z)$, where r is the distance from the center of the substrate and z is the distance above the substrate. A diffusive velocity $v_o$ of etchant species in the plate stack zone is characterized by Fick's law.

$$v_o = -D \frac{\nabla n_o}{n_o}$$

In a specific embodiment, a gap $d_{gap}$ above the substrate is much less than the lateral extent $d_{gap} \ll r$ and gas phase mass transfer resistance across the small axial distance is negligible so that the axial (z-direction) term of the concentration gradient can be ignored. The embodiment can be applied without this restriction; however, numerical mesh computer solutions are then required to evaluate the reaction rate constant and uniformity. In the embodiment, the surface etching reaction bears a first order form:

O+S→SO where

S is a substrate atom (e.g., resist unit "mer"); and

O is the gas-phase etchant (for example oxygen atoms) with certain etching kinetics. The first order etching reaction can be defined as follows:

$$R_{os} = n_o A \sqrt{T} \, e^{-E_{ACT}/RT}$$

where $R_{os}$ defines a reaction rate;

$n_o$ defines a concentration;

A defines a reaction rate constant;

T defines a temperature;

$E_{ACT}$ defines an activation energy; and

R defines a gas constant. An example of the first reaction is described in D. L. Flamm and D. M. Manos "Plasma Etching," (1989), which is hereby incorporated by reference for all purposes. Of course, other order reactions, reaction relations, and models may be applied depending upon the particular application.

Figure 1A:
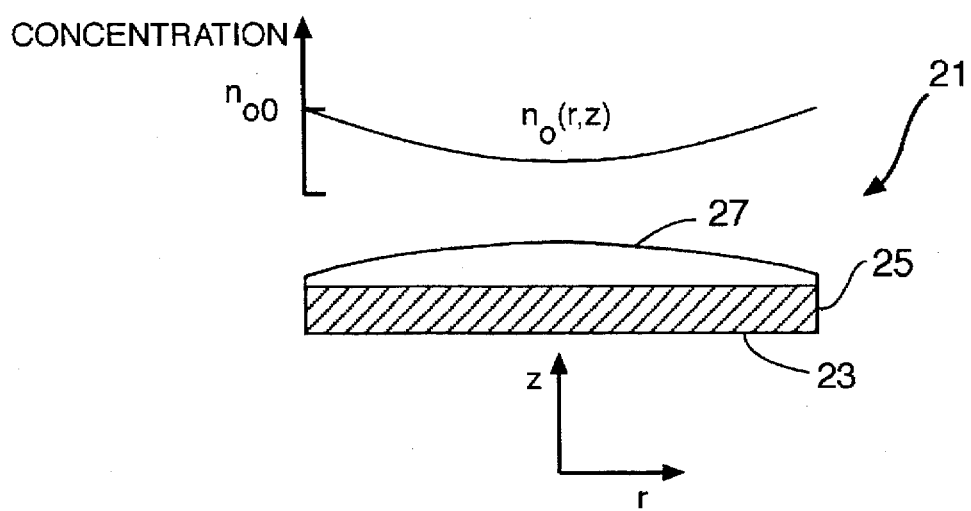
FIG. 1A is a simplified cross-sectional view of a wafer profile according to the plasma etching apparatus of FIG. 1.

An example of an etched substrate 21 from the plate stack zone is illustrated by FIG. 1A. The substrate 21 is defined in spatial coordinates such as z and r. The substrate includes a bottom surface 23, sides 25, and a top surface film 27. As can be seen, the top surface film includes a convex region, or etching profile. The etching profile occurs by way of different etch rates along the r-direction of the substrate corresponding to different etchant species concentrations. A concentration profile $n_o(r,z)$ is also shown where the greatest concentration of reactant species exists at the outer periphery of the top surface film. In the present invention, an etch rate constant may be obtained by correlation to the etching profile. By way of the etch rate constant, other etching parameters such as certain reactor dimensions including a distance between substrates, pressure, temperature, and the like are easily calculated.

Figure 2:
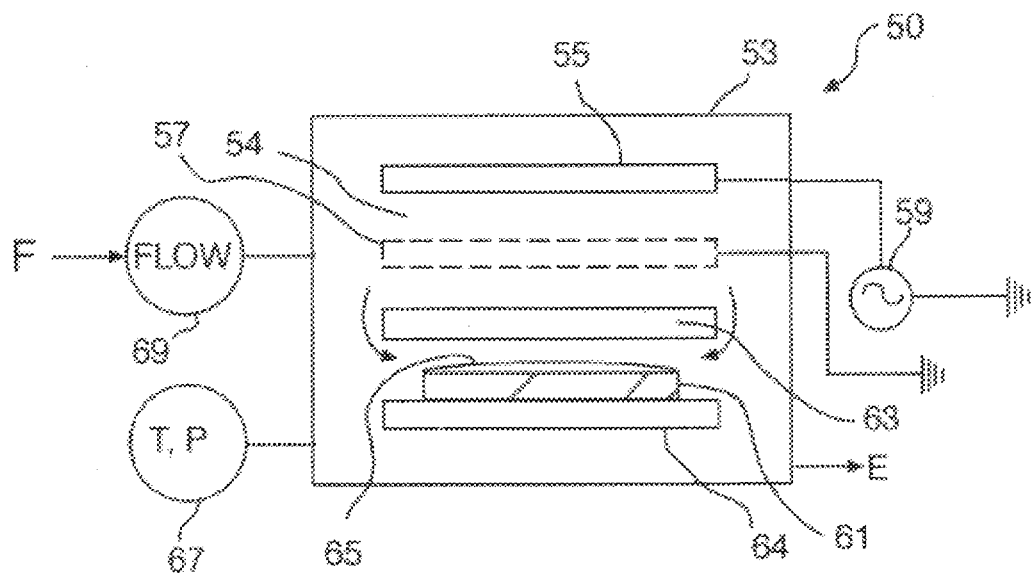
FIG. 2 is a simplified diagram of an alternative embodiment of a plasma etching apparatus according to the prevent invention.

FIG. 2 illustrates an alternative example of an etching apparatus 50 according to the present invention. The etching apparatus 50 is a single wafer etching apparatus with elements such as a chamber 53, a top electrode 55, a bottom electrode 57, a power source 59, a platen 64, and others. The bottom electrode 57 is at a ground potential, and the top electrode is operably coupled to the power source 59 at a high voltage potential. A plasma exists in a region 54 between the top electrode 55 and the bottom electrode 57, which is often a grid configuration or the like. Reactant species are directed via power source from a plasma source to a wafer substrate 61 by diffusion. A temperature and pressure controller 67 and a flow controller 69 are also shown. The etching apparatus also includes a chemical source feed F and a exhaust E. Of course, other elements may also be available based upon the particular application.

By way of a plate 63 interposed between the wafer substrate 61 and the bottom electrode 57, the reactant species do not directly bombard the wafer substrate. The plate is preferably made of an inert material appropriate for the particular etching such as pyrex or glass for resist ashing, alumina for fluorine atom etching of silicon, silicon nitride, or silicon dioxide, and the like. In an ashing reaction, the plate is placed at a distance ranging from about 5 mm to 50 mm and less from the wafer substrate 61. Of course, other dimensions may be used depending upon the particular application. The reactant species are transported via diffusion from the plasma source to the wafer substrate around the periphery of the plate 63. Accordingly, the reaction rate at the wafer substrate is controlled by a balance between chemical reaction and diffusion effects, rather than directional bombardment.

By way of the diffusion effects, an etching rate constant may be obtained for the etching apparatus 50 of FIG. 2. In particular, the etching rate constant derives from a etching profile 65, which can be measured by conventional techniques. The present invention uses the etching rate constant to select other etching rate parameters such as reactor dimensions, spacing between the substrate and its adjacent surface, temperatures, pressures, and the like. But the present invention can be used with other reactor types where etching may not be controlled by diffusion. For example, the present invention provides a reaction rate which can be used in the design of reactors where diffusion does not control such as a directional etcher and the like. The reaction rate constant may also be used in the directional etcher to predict an extent of, for example, undercutting of unprotected sidewalls while ion bombardment drives reaction in a vertical direction. Of course, the invention may be applied to other reactors such as large batch, high pressure, chemical, single wafer, and others. The invention can also be applied to different substrate materials, and the like.

Plasma Etching Method

Figure 5A:
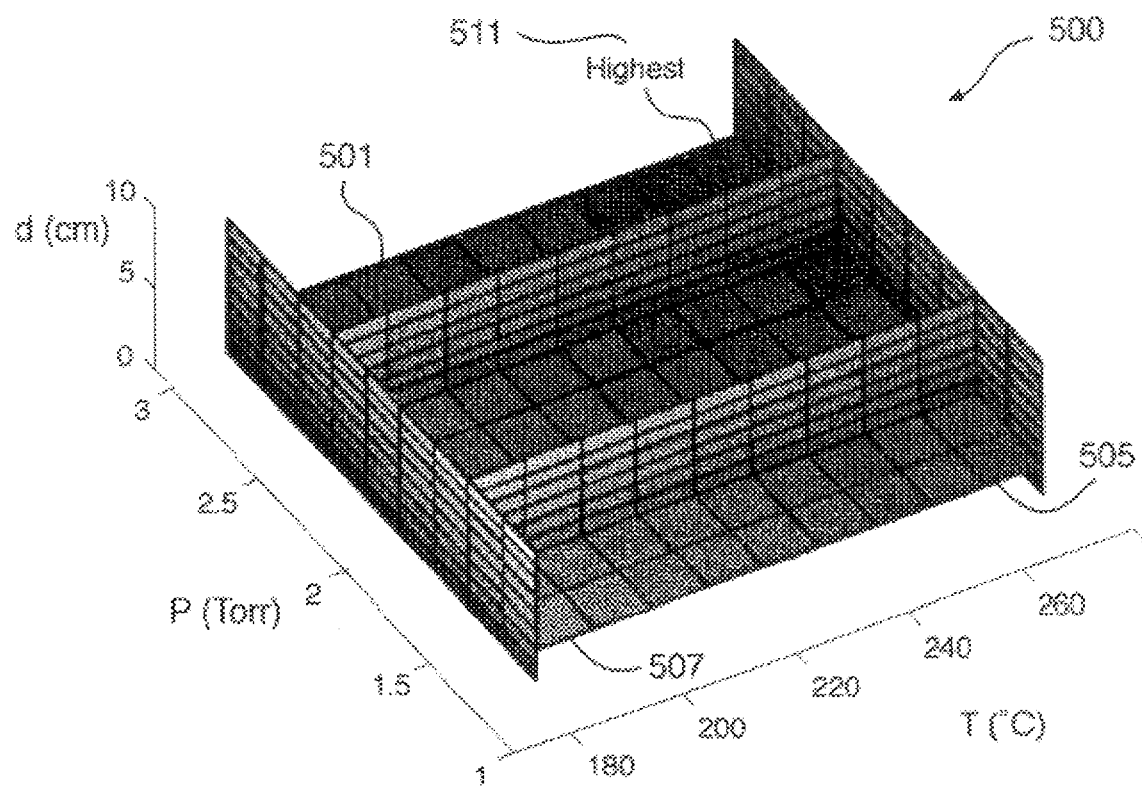
FIG. 5A is a plot of uniformity, temperature, pressure, and gap for an etching process according to the present invention.
Figure 3:
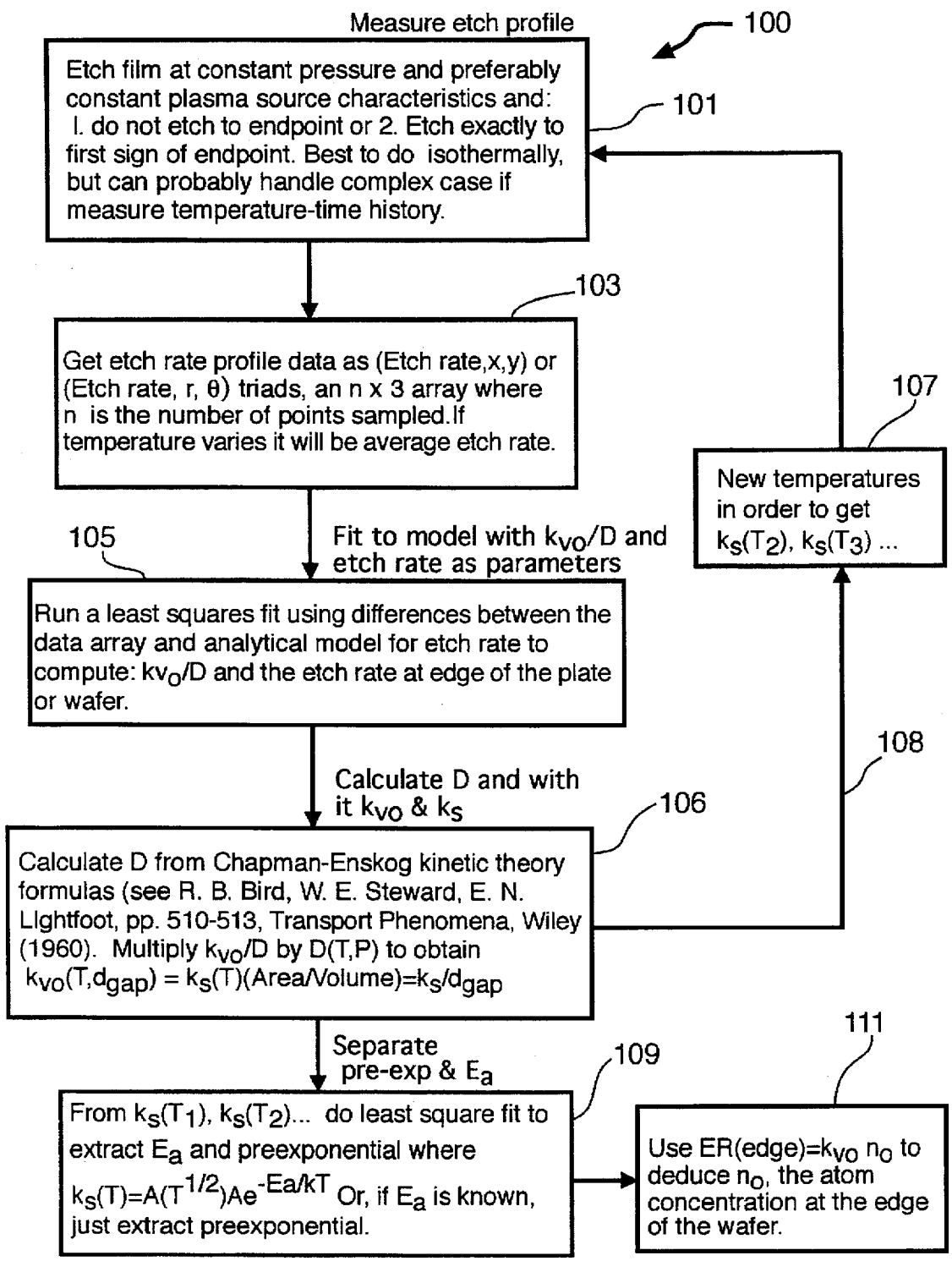
FIGS. 3–5 are simplified flow diagrams of plasma etching methods according to the present invention.
Figure 4:
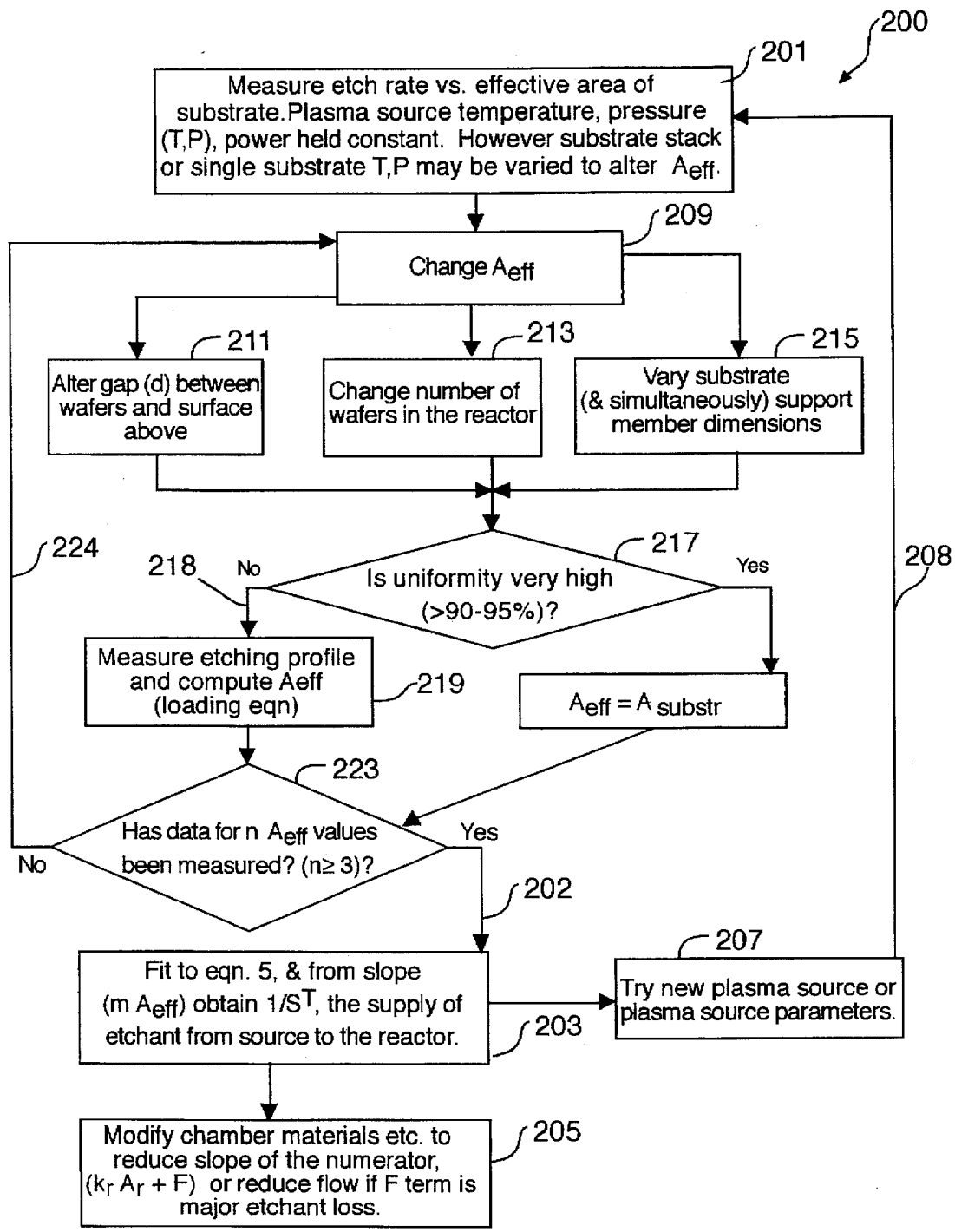
Figure 5:
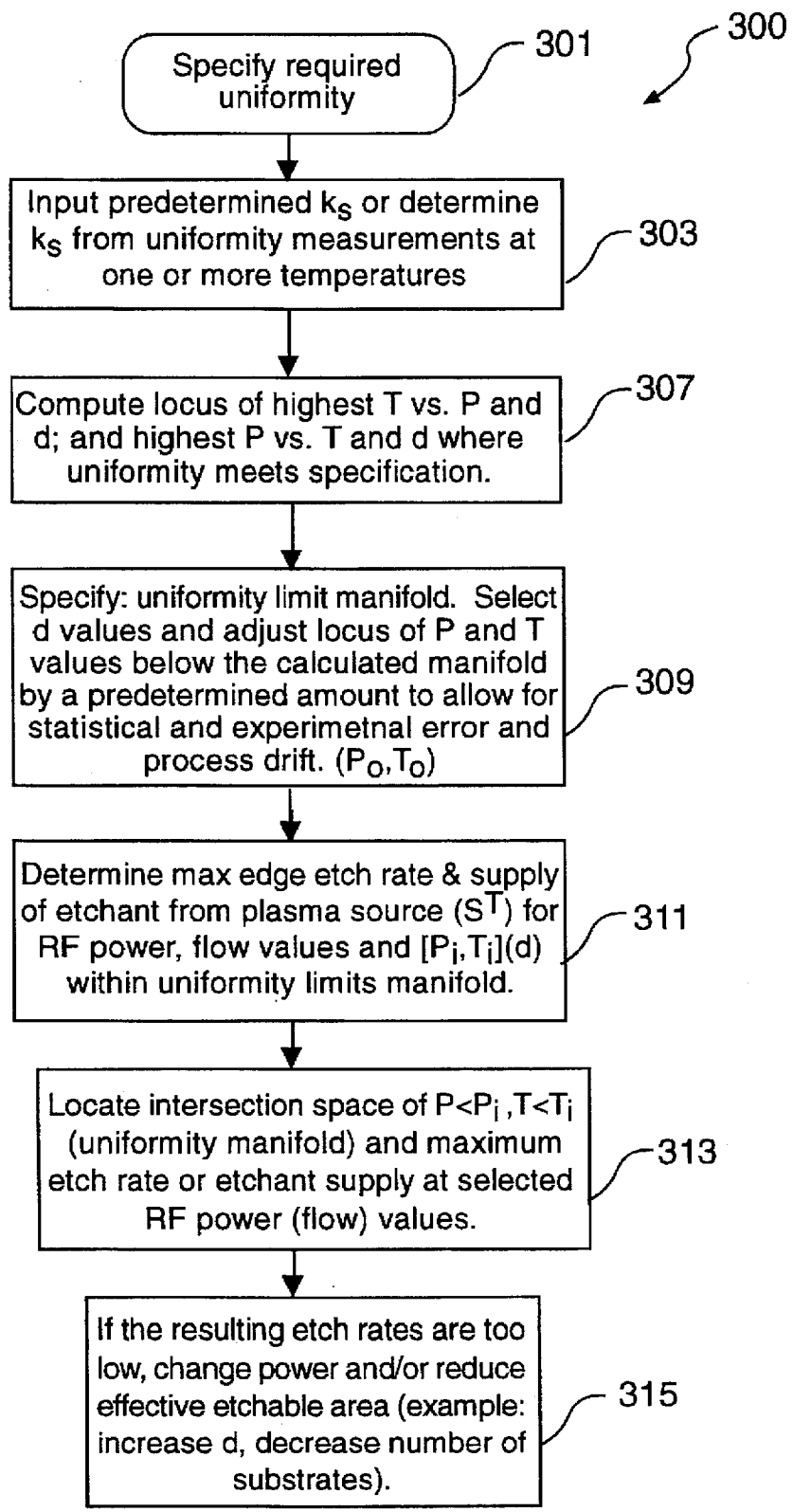

FIGS. 3–5 illustrate simplified flow diagrams of plasma etching methods according to the present invention. The present methods provide for improved etching conditions by way of a reaction rate constant derived from, for example, an etching profile. It should be noted that the present methods as illustrated should not be construed as limiting the invention as defined in the claims. One of ordinary skill in the art would easily recognize other applications of the inventions described here.

In a specific embodiment, a method of extracting a rate constant 100 for a plasma etching step according to the present invention is illustrated by the flow diagram of FIG. 3. A substrate with an overlying film is placed into a plasma etching apparatus or the like. The overlying film is defined as an etching film. In the present embodiment, the overlying film is a photoresist film, but can also be other films such as a silicon film, a polysilicon film, silicon nitride, silicon oxide, polyimide, and the like.

A step of plasma etching the film is performed by step 101. The plasma etching step occurs at constant pressure and preferably constant plasma source characteristics. More preferably, the plasma etching step occurs isothermally at temperature $T_1$, but can also be performed with changing temperatures where temperature and time histories can be monitored. Plasma etching of the film stops before the endpoint (or etch stop). Alternatively, plasma etching stops at a first sign of the endpoint (or etch stop). The plasma etching step preferably stops before etching into an etch stop layer underlying the film to define a "clean" etching profile.

The substrate including etched film is removed from the chamber of the plasma etching apparatus. The etched film includes an etching profile (step 103) made by way of plasma etching (step 101). The etching profile converts into a relative etch rate, relative concentration ratio, a relative etch depth, and the like at selected spatial coordinates. The relative etch rate is defined as an etch rate at a selected spatial coordinate over an etch rate at the substrate edge. The relative concentration ratio is defined as a concentration of etchant species at a selected spatial coordinate over a concentration of etchant at the substrate edge.

In x-y-z coordinates, the relative etch rate in the z-direction, and the spatial coordinates are defined in the x-y coordinates. The etching profile is thereby characterized as a relative etch rate u, a x-location, and a y-location u, (x, y). In cylindrical coordinates, the relative etch rate is also in the z-direction, and the spatial coordinates are defined in the r and $\theta$ coordinates. The etching profile is characterized as a relative etch rate u, a r-location, and a $\theta$-location (u, r, $\theta$). An array of data points in either the x-y coordinates or r-$\theta$ coordinates define the etching profile. The array of data points can be defined as an n×3 array, where n represents the number of points sampled and 3 represents the etch rate and two spatial dimensions. Of course, the choice of coordinates depends upon the particular application.

Optionally, in a non-isothermal condition, an average etch rate is measured. By approximate integration of a time dependent etch rate, suitable starting point approximations for an etching rate constant pre-exponential and activation energy can be selected. The etch rate is integrated over time (and temperature) using measured temperature-time data (or history). An etched depth profile and the etching rate from the integration can then be compared with actual data. A rate constant is appropriately readjusted and the aforementioned method is repeated as necessary.

An etch constant (or a reaction rate constant) over diffusivity ($k_{vo}/D$) and an etch rate at an edge is calculated at step 105. The etch constant over diffusivity correlates with data points representing the etch rate profile. In x-y coordinates, the relationship between $k_{vo}/D$ and the relative etch rate u(x,y) is often defined as follows:

where
a and b define substrate lengths in, respectively, an x-direction and a y-direction.

$$u(x,y) = \sum_{m=1}^{\infty} \frac{4}{m\pi} \sin\frac{m\pi}{2} \left\{ \frac{\cosh[\sqrt{k_{vo}/D + (m\pi/b)^2}\ x]}{\cosh\left[\sqrt{k_{vo}/D + (m\pi/b)^2}\ \frac{a}{2}\right]} \cos\frac{m\pi y}{b} + \frac{\cosh[\sqrt{k_{vo}/D + (m\pi/a)^2}\ y]}{\cosh\left[\sqrt{k_{vo}/D + (m\pi/a)^2}\ \frac{b}{2}\right]} \cos\frac{m\pi x}{a} \right\}$$

In cylindrical coordinates, the relationship between the etch constant over diffusivity $k_{vo}/D$ and the relative etch rate u(r) is defined as follows:

$$u(r) = \frac{I_o\left(\sqrt{\frac{k_{vo}}{D}}\ r\right)}{I_o\left(\sqrt{\frac{k_{vo}}{D}}\ a\right)}$$

where
a is an outer radius (or edge) of the substrate and $I_o$ is modified Bessel function of the first kind.

In step 106, a diffusivity is calculated for the particular etchants. The binary diffusivity $D_{AB}$ may be calculated based upon the well known Chapman-Enskog kinetic theory equation:

$$D_{AB} = 2.2646 \times 10^{-5} \frac{\sqrt{T\left(\frac{1}{M_A} + \frac{1}{M_B}\right)}}{\sigma_{AB}^2 \Omega_{D,AB} C}$$

where
T is a temperature;
c is a total molar concentration;
$M_A$ and $M_B$ are molecular weights;
$D_{AB}$ is a binary diffusivity;
$\sigma_{AB}$ is a collision diameter; and
$\Omega_{D,AB}$ is a collision integral.

The Chapman-Enskog kinetic theory equation is described in detail in part III of R. B. Bird, W. E. Stewart, and E. N. Lightfoot, "Transport Phenomena," Wiley (1960) which is hereby incorporated by reference for all purposes. Of course, other techniques for calculating a diffusivity may also be used. The equivalent volumetric reaction rate constant $k_{vo}$ is derived from the diffusivity as follows.

$$k_{vo} = \left(\frac{k_{vo}}{D}\right) D_{AB}$$

Once the reaction rate constant $k_{vo}$ is extracted, the surface reaction rate constant $k_s$ may be isolated from the previous equation as follows.

$$K_s = (k_{vo}) d_{gap}$$

Repeat steps 101–106 at different temperatures $T_2$, $T_3 \ldots T_n$ to calculate additional reaction rate constants $k(T_2)$, $k(T_3) \ldots k(T_n)$. The steps are repeated at least two times and more, and preferably at least three times and more. Each temperature is at least 5° C. greater than the previous temperature. Of course, the selection of temperatures and trial numbers depend upon the particular application.

Extract an activation energy $E_{act}$ for a first order reaction from the data $k(T_2), k(T_3) \ldots k(T_n)$ at $T_2, T_3 \ldots T_n$ collected via step 109 by way of the following equation:

$$k_s(T) = A\sqrt{T}\ e^{\frac{-E_{act}}{RT}}$$

The activation energy is preferably calculated by a least square fit of data collected at step 109 or any other suitable statistical technique. By way of the same equation, the present method calculates surface reaction rate constant $k_s$ at any temperature.

In step 111, a concentration $n_o$ at the substrate edge is calculated. The concentration $n_o$ deduces from the following relationship:

$$n_o = R_{15}/K_s$$

where $R_{os}$ is an etch rate.

From the concentration and the surface reaction rate, the particular etching step can be improved by way of adjusting selected etching parameters.

In an alternative specific embodiment, a method to "tune" a plasma source using a loading effect relationship (or equation) is illustrated by the simplified flow diagram 200 of FIG. 4. The method includes a step 201 of measuring an etch rate against an effective etchable area $A_w$. The effective etchable area changes by varying the number m of wafers in the reactor, varying the size of the wafer, or the like. The effective area can be changed 209 by altering a gap between a wafer and its above surface 211, changing wafer quantity in the reactor 213, and varying substrate support member dimensions 215. The method preferably occurs at constant temperature and pressure. However, the effective etchable area may also be varied by way of changing a temperature and/or a pressure.

The method calculates a uniformity value (step 217) from the measured values of etch rate vs. effective area in steps 211, 213, and 215. The uniformity is calculated by, for example:

$$\text{uniformity} = 100[1 - * \frac{R_{MAX} - R_{MIN}}{2 \sum_{i=1}^{m} \frac{R_i}{m}}]$$

where $R_{MAX}$ is a maximum etch rate;

$R_{MIN}$ is a minimum etch rate;

m is a sample number;

$R_i$ is a general etch rate for an ith sample; uniformity is a planarity measurement in percentage.

In a specific embodiment, a uniformity of about 90% and greater or preferably 95% and greater indicates that the effective area of the substrate is substantially equal to the actual substrate area (step 221) via branch 216. Of course, other methods of calculating a uniformity from etch rates and effective areas may also be used depending upon the particular application. Alternatively, an etching profile is measured and the effective area $A_{\textit{eff}}$ is calculated (step 219) by way of, e.g., the loading effect relationship.

At least two and more different effective etchable areas (step 223) are measured, or preferably at least three and more different etchable areas are measured. Alternatively, the flow diagram returns via branch 224 to step 209, and takes another etch rate measurement at a different effective area. The flow diagram then turns to step 203.

In step 203, a supply of etchant $S^T$ in the reactor is calculated. Based upon the different etchable areas a slope $mA_{\textit{eff}}$ deduces from the loading effect relationship as follows.

$$\frac{1}{R_{os}(m)} = \frac{1}{k_s n_o} = \frac{k_r A_r + F}{k_s S^T} + \frac{mA_{\textit{eff}}}{S^T}$$

where $R_{os}(m)$ is the etching rate at the boundary between the plate stack zone and transport zone when m substrates are present in the reactor. The first term includes a recombination term proportional to the total effective area $A_r$, which acts to catalyze loss of etchant on reactor surfaces in the reactor plus a convection term F. The second term is the loading effect relation, where the reciprocal etch rate is proportional to the amount of effective etchable substrate area $A_{\textit{eff}}$ times the number of substrates m. When the etching across a substrate is uniform, $A_{\textit{eff}}$ is the geometrical substrate area $A_w$. When etching is nonuniform, on the other hand, $A_{\textit{eff}}$ is a function of $k_{\textit{re}}/D$ and geometrical reactor dimensions. The supply of etchant $S^T$ may be calculated for a different plasma source or plasma source parameters such as temperature, pressure, or the like by repetition 207 of steps 201 and 203. By way of the supply of etchant to the reactor, other plasma source parameters may be varied to obtain desired etching rates and uniformity for the particular reactor.

Step 205 provides for the modification of chamber materials and the like to reduce slope numerator ($k_r$, $A_r$+F) in selecting the desired etching conditions. The chamber materials can be modified to reduce, for example, the recombination rate in the reactor. The recombination rate is directly related to the effective reactor recombination area $A_r$. In step 205, the recombination rate can be adjusted by changing $A_r$ via changing chamber material, coating chamber surfaces with, for example, a product sold under the trademark TEFLON™ or KALREZ™ and the like, among others. Alternatively, the slope numerator flow term F is reduced when F contributes as a substantial loss term. Of course, the particular materials used depend upon the application.

In step 207, the method changes plasma source parameters such as rf power, flow rate, and the like to select desired etching conditions. Once one of the aforementioned parameters is adjusted, the method returns to step 201 via branch 208. At step 201, an etch rate vs. effective etchable area is measured and the method continues through the steps until desired etching condition are achieved. Of course, other sequences of the aforementioned step for tuning the plasma source may also exist depending upon the particular application.

FIG. 5 is a simplified flow diagram for a method of selecting a desired uniformity and desired etching parameters within selected ranges to provide a desired etch rate for a particular etching process. The etching parameters include process variables such as reactor dimensions, a pressure, a temperature, and the like for a particular substrate and reactants. Other etching parameters may also be used depending upon the particular application.

In step 301, select a uniformity for the selected substrate and the reactants. The selected uniformity becomes an upper operating limit for the reaction according to the present method. The upper operating limit ensures a "worst case" uniformity value for an etched substrate according this method. Uniformity can be defined by, for example:

$$\text{uniformity} = 100 \left[ 1 - * \frac{R_{MAX} - R_{MIN}}{2 \sum_{i=1}^{m} \frac{R_i}{m}} \right]$$

where $R_{MAX}$ is a maximum etch rate;
$R_{MIN}$ is a minimum etch rate;
m is a sample number;
$R_i$ is a general etch rate for an ith sample; uniformity is a planarity measurement in percentage.

In certain embodiments, the selected uniformity ranges from about 90% and greater or more preferably 95% and greater. Of course, other uniformity values may be selected based upon the particular application.

Based upon the selected uniformity, use the selected uniformity as a stating point to extract a plurality of reaction rate constants $k_s$. The reaction rate constants may be also be obtained by an input activation energy for the etching process, among other techniques (step 303). Alternatively, calculate $k_s$ at one or more temperatures, and preferably two or more temperatures (step 303) from a plurality of uniformity values. The uniformity values can be within the selected uniformity or outside the selected uniformity.

In step 307, prepare an array of etching parameters including a temperature T, a pressure P, a characteristic reactor dimension, and a uniformity value. In an embodiment, the characteristic reactor dimension can be a gap $d_{gap}$ between the substrate and its adjacent surface. The array of etching parameters can be illustrated by way of a three dimensional plot.

An example of such array is illustrated by way of a three dimensional plot 500 in FIG. 5A. It should be noted that the illustration is merely an example of one application of the specific embodiment, and other examples can readily be determined by one of ordinary skill in the art. The plot includes a temperature axis, a pressure axis, and a gap axis. Each square region 501 represents a point defined by a specific temperature, pressure, and gap. Each square region 501 also includes a gray scale. Each different gray scale corresponds to a different uniformity value. In this example, the darker gray scale values 505 represent lower uniformity values than the lighter gray scale values 507.

Based upon the array, compute locus of highest T, versus P and $d_{gap}$, and of highest P, versus. T and $d_{gap}$ 511 where uniformity meets the specification, e.g., the selected uniformity from step 301. All points bounded within the highest T, versus P and $d_{gap}$, and the highest P, versus T and $d_{gap}$ fall within the uniformity specification. Points outside the highest T. versus P and $d_{gap}$ and the highest P, versus T and $d_{gap}$ fall outside the uniformity specification. The points that fall within the Uniformity specification defines the calculated uniformity limit manifold having outer boundaries at $P_o$ and $T_o$.

In the calculated uniformity limit manifold, select a gap $d_{gap}$, and adjust a locus of P and T below the calculated uniformity limit manifold by a predetermined amount to allow for statistical and experimental error and process drift. This step defines a new uniformity limit manifold, and ensures that points defined by a temperature, a pressure, and a gap, selected during subsequent steps fall within the selected uniformity (step 301) despite any error or process drift from the calculation. The new uniformity limit manifold includes outer boundaries at $P_i$ and $T_i$ which are respectively less than $P_o$ and $T_o$.

In step 311, a maximum edge etch rate $R_{o,s}$ and supply of etchant from a plasma source (S) for a selected rf power, a reactant flow, a pressure, a temperature, and a gap within the new uniformity limit manifold is determined. The maximum edge etch rate can be used in defining a desired flow rate of source chemicals. Once the desired flow rate is determined, it should be held constant during subsequent steps in the embodiment.

A step (step 313) of locating an intersection space of P<Pi, T<Ti, and a maximum etch rate (or an etchant supply) at selected rf power values is included. The intersection of space defines a maximum etch rate for the selected pressure P, temperature T, and gap d. Of course, other etching parameters may be adjusted depending upon the particular application.

The method provides a resulting etch rate from the etching reaction using the aforementioned parameters which is compared with a desired etch rate. If the resulting etch rate is too low (or high), change power and/or reduce the effective etchable area, e.g., increase $d_{gap}$, decrease number of substrates, use smaller substrates, and the like. Of course, other sequences of steps may be used in selecting a desired temperature, pressure, gap, and other parameters to provide the desired etch rate. The embodiment provides for a desired etch rate with a selected uniformity based upon a range of temperatures, pressures, and gap values, all within the selected uniformity specification.

Theoretical Model of Apparatus

1. Plasma Generating Zone

In the specific embodiment, the plasma generating zone can be modeled as a "black box" where etchant flow of reactant species from the plasma generating source is determined from an etching rate at the plate stack zone. In particular, the etching rate is proportional to a product $n_o k_s$ of etchant concentration $n_o$ above an etchable material film surface and an etching reaction rate constant $k_s$. The etching reaction rate constant $k_s$ can be independently determined from uniformity data previously noted. Since the relative change in $n_o k_s$ and the absolute value of $k_r$ (the effective surface recombination rate per unit reactor area) can be determined, $n_o$ is easily extracted and used to study the effects of discharge and surface parameters on production of etchant species in the plasma generating zone. Accordingly, the efficiency of radical production by the plasma generating zone (the source term in a mass the mass balance of $n_o$) as a function of various parameters (pressure, power, temperature, etc.) can be extracted from indirect measurements.

2. Transport Zone

In the specific embodiment, etchant species concentrations in the transport space zone are approximated as "well-mixed". In the well-mixed embodiment, substantially all etchant species in the transport space zone are supplied by the plasma generating zone and are removed by at least: 1) etching reactions in the plate stack zone; 2) recombination; or 3) convection by flow out of the reactor. A supply $S^T$ of etchant from the plasma generating zone is equated to the three aforementioned loss terms as follows:

$$S^T = k_r A_r n_o + m A_{eff} k_s n_o + F n_o$$

where $k_r A_r$ is an effective loss term with regard to recombination effects, $k_s$ is an etching reaction rate constant, $A_{eff}$ is an effective etchable area of a substrate, $n_o$ is the etchant concentration, m is the number of substrates and F is the gas flow rate out of the reactor. The equation may be rewritten in the form of a canonical loading effect relationship:

$$\frac{1}{R_o(m)} = \frac{1}{k_r n_o} = \frac{k_r A_r + F}{k_r S^T} + \frac{m A_{\text{eff}}}{S^T}$$

Where $R_o(m)$ is the etching rate at the boundary between the plate stack zone and transport zone when m substrates are present in the reactor, and the first term includes a recombination term proportional to the total effective area $A_r$ which acts to catalyze loss of etchant on reactor surfaces plus convection F. The second term is the loading relation, wherein the reciprocal etch rate is proportional to the amount of effective etchable substrate area $A_{\text{eff}}$ times the number of substrates m. When the etching across a substrate is uniform, $A_{\text{eff}}$ is the geometrical substrate area $A_w$. When etching is nonuniform, on the other hand, $A_{\text{eff}}$ is a function of $k_{vo}/D$ and geometrical reactor dimensions. Accordingly, $A_{\text{eff}}$ becomes a function of parameters such as temperature, pressure, reactor configuration, and the like.

Figure 6:
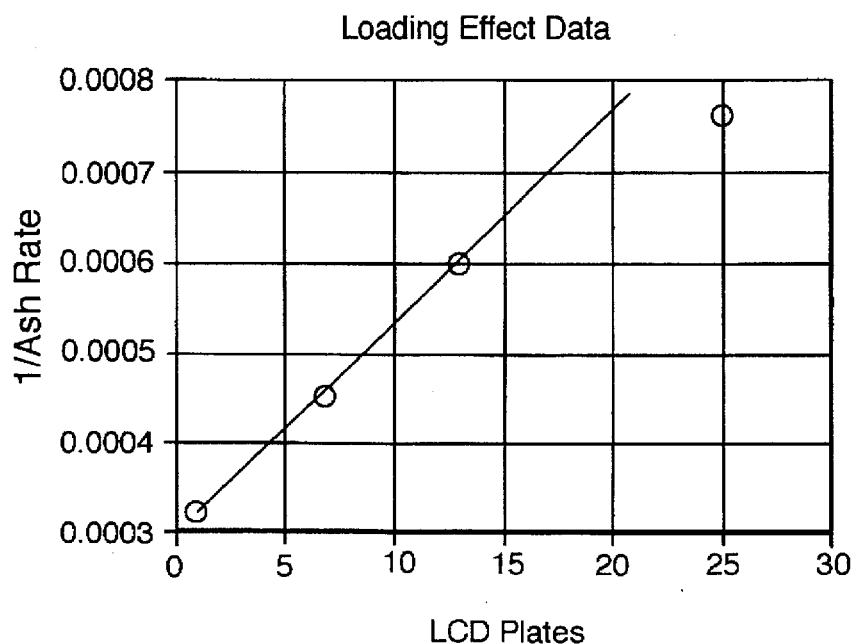
FIG. 6 is a simplified plot of i/ash rate vs. LCD plate number according to the present invention.

FIG. 6 shows etch rate data vs. the number of substrates in a reactor along with a line corresponding to the loading effect relationship in the form $$\frac{1}{\text{Ash Rate}} = C_o + C_1 m A_w$$

where
$C_o = 0.00030171936426$ min/Å;
and $C_t A_w = 2.3003912550 \times 10^{-5}$ are best fit constants for the conditions in FIG. 6. The equation gives an etching rate at the edge of the plate stack zone as a function of the number of substrates m and etchable exposed effective surface of a substrate $A_{\text{eff}}$. Other variables such as the temperature, etchant generation rate, flow rate, and reactor size parameters were held constant. While $R_o(m)$ as written strictly applies to the etch rate at the edge of a substrate, when etching uniformity is high the etching rates at any other fixed relative position on the substrates are related to $R_o(m)$ by a constant factor of proportionality, and so they will also conform to the form of these relations.

In the general case where etching is nonuniform across a substrate, the equivalent area $A_w$ is smaller than the geometrical substrate area by a constant factor as a function of $k_{vo}/D$. It turns out that $k_s$ can be independently deduced from the profile of the etching rate in the stack zone, and in turn permits the absolute value of $n_o$ to be computed from the etching rate $R_o(m)$ at the edge of a substrate. If the slope of the isothermal loading effect curve $$\frac{\partial \left[\frac{1}{k_r n_o}\right]}{\partial m} = \frac{A_{\text{eff}}}{S^T}$$

is measured along with etching uniformity, the rate of etchant supplied by the source $S^T$ can be found by for substituting $A_{\text{eff}}(k_{vo}/D)$ evaluated on the basis of etching uniformity measurements.

3. Stack Zone

For etchant mass transport from the transport zone into the plate stack zone, the distance between stacked wafers $d_{gap}$ is small compared to the lineal dimensions of a substrate in the embodiment. Consequently, it will be assumed that the concentration is substantially uniform in the axial z direction and there is equi-molal, isothermal, and isobaric counter-diffusion (e.g., no net flux, $\Sigma n_i = 0$) x and y directions. Since the ashing reaction is proportional to $n_o$, and O-atom consumption is proportional to the ashing rate, the continuity equation for O-atoms in two dimensions becomes:

$$\frac{\partial n_o}{\partial t} + \nabla \cdot n_o v = -k_{vo} n_o$$

where $k_{vo}$ is the volume equivalent surface reaction rate constant, and v is the diffusive velocity of oxygen atoms. Inserting Fick's law $$n_o v = -D \nabla n_o$$

the diffusion equation is obtained $$\frac{\partial n_o}{\partial t} - \nabla(D \nabla n_o) = -k_{vo} n_o$$

And at steady-state in two dimensions and where D is not a function of spatial coordinate(s), it is rewritten as $$\frac{\partial^2 u}{\partial x^2} + \frac{\partial^2 u}{\partial y^2} = \frac{k_{vo}}{D} u$$

Where $u(x,y) = n_o(x,y)/n_{oO}$ and $n_{oO}$ is the etchant concentration at the outer edges of the substrates. The boundary conditions are therefore $u = 1$. The equation is cast in dimensionless form as $$\frac{\partial^2 u}{\partial^2(x/L_x)} + \frac{\partial^2 u}{\partial^2(y/L_y)} = \frac{k_{vo}}{D} u$$

where $L_x$ and $L_y$ are characteristic independent lengths and widths of substrates. From this equation, it is clear that $u(x/L_x, y/L_y)$ is a function solely of $k_{vo}/D$ and the boundary conditions. Consequently, if experimental values of $u(x/L_x, y/L_y)$ are measured at two positions on the substrate (i.e., at the center and edge), two algebraic equations based on this measurement can be used to eliminate $n_o/n_{oO}$ and solve for $k_{vo}/D$. The diffusivity D can be calculated to good accuracy with the Hirshfelder equation; hence, $k_{vo}$ is measured with this procedure.

For circular substrates, there is only one independent dimension (e.g., where r=a is the substrate radius). At steady state in one dimensional cylindrical coordinates the equation can be written:

$$\frac{1}{r} \frac{\partial \left(r \frac{\partial u}{\partial r}\right)}{\partial r} + \frac{\partial u}{\partial z} = \frac{k_{vo}}{D} u$$

where $u(r) = n_o(r)/n_{oO}$ and the boundary condition is $u(a) = 1$ at the substrate (wafer) edge.

In the subsequent sections, analytic solutions to these relationships are developed for rectangular and circular substrates (e.g., for flat panel display substrates and semiconductor wafers). The framework is used to derive uniformity relationships for flat panel resist stripping equipment.

EXAMPLES

1. Circular Substrate (Wafer) Stacked Etcher

Figure 7:
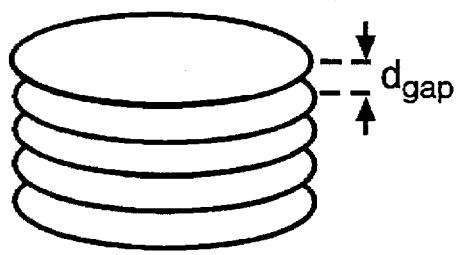
FIGS. 7–9 illustrate an example with regard to circular substrates according to the present invention.

To prove the principles of the aforementioned embodiments, the present method and apparatus was applied to etching of circular substrates in a stacked etcher. Of course, the present method and apparatus can be applied to other geometries and etcher types. The present example is therefore not intended to be limiting in any way. The present method and apparatus is applied to the circular substrates as illustrated by way of FIG. 7. The present method relies upon etching of substrate material S by way of oxygen using a reaction which is substantially chemical etching.

Figure 8:
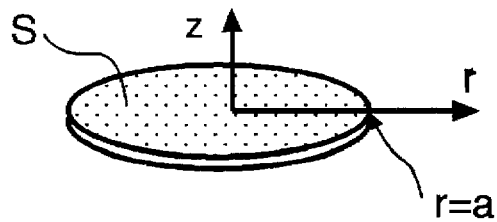

An illustration of a circular substrate according to the present invention is shown in FIG. 8. Assume that the distance $d_{gap}$ between stacked wafers is relatively small compared to the wafer radius a such that $d_{gap} \ll a$. Based upon the assumption, the oxygen concentration will be substantially uniform in the axial direction z. Accordingly, only radial diffusion in the r-direction needs consideration. Assuming an equi-molal counterdiffusion $$\sum_{i=1}^{m} n_i v_i = 0$$

and an isobaric and isothermal stack zone, the problem reduces to two dimensions and becomes $$\frac{1}{r} \frac{\partial \left( r \frac{\partial u(r)}{\partial r} \right)}{\partial r} = \frac{k_{vo}}{D} u(r)$$

where $u(r) = n_o(r)/n_{oO}$. The boundary condition is $u(a)=1$ at a wafer edge, and the solution of the equation becomes $$u(r) = c_1 I_o \left( \sqrt{\frac{k_{vo}}{D}} \, r \right) + c_2 K_0 \left( \sqrt{\frac{k_{vo}}{D}} \, r \right)$$

where $I_0$ and $K_0$ are modified Bessel functions of the first and second kind, respectively, and $c_1$ and $c_2$ are constants. For a finite, normalized oxygen concentration $u(O)$ at the center of the wafer, the equation requires $c_2=0$. The remaining boundary condition of $u(a)=1$, sets the solution:

$$u(r) = \frac{I_o \left( \sqrt{\frac{k_{vo}}{D}} \, r \right)}{I_o \left( \sqrt{\frac{k_{vo}}{D}} \, a \right)}$$

Note that the functional form $u(r)$ describes both the relative etch rate profile $R_o(r)/R_o(a)$ and the relative oxygen atom etchant concentration $n_o(r)/n_o(a)$. The relative etch rate profile can easily be obtained by measuring an etching rate profile on a circular substrate made by way of the present method.

Figure 9:
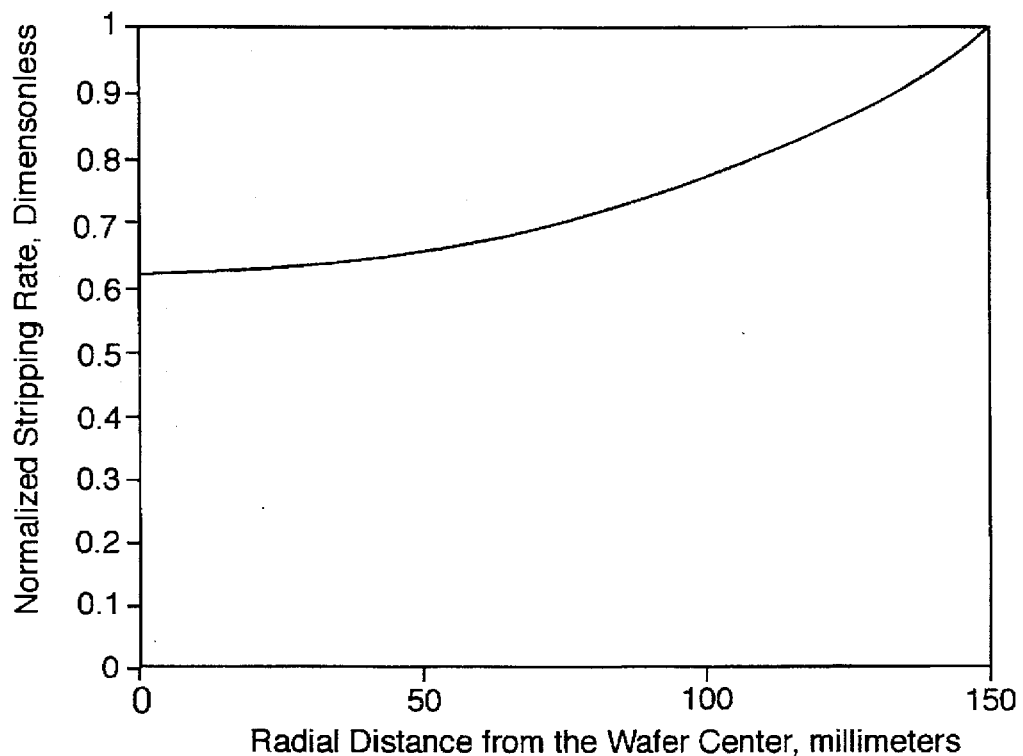

FIG. 9 is a simplified plot of a normalized stripping rate vs. radial distance from a wafer center for the circular substrate example. The plot shows a profile of $u(r)$ for $k_{vo}/D=0.1$, and $a=150$ mm. As can be seen, the normalized stripping rate is lower at a center region of the wafer, and increases to 1 at the wafer edge. Based upon a slope of the plot, a reaction rate coefficient can be extracted by way of a diffusivity.

2. Rectangular Substrate Stack Asher

Figure 10:
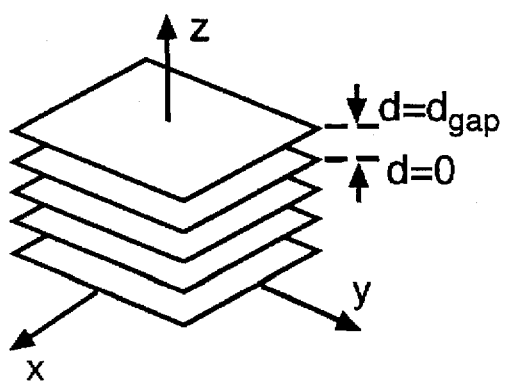
FIGS. 10–12 illustrate an example with regard to rectangular substrates according to the present invention.
Figure 11:
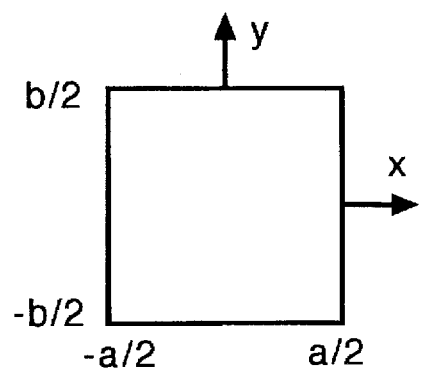

To further provide the principle and operation of the present method and apparatus, the present method and apparatus is applied to a rectangular substrate configuration in a stack asher. Again, the present example should not be taken as limiting the scope of the claims described herein, but is merely an example. An analytical solution for etching profiles in the stack zone are derived for etching/ashing a stack of rectangular substrates as illustrated in FIG. 10. The rectangular substrate can be a flat panel display such as a liquid crystal display (LCD) plate and the like in the coordinate system of FIG. 10. To solve an equation for the present rectangular configuration where D is not dependent upon spatial coordinates, write the solution as:

$$u = u_1 + u_2$$

where $u_1$ is satisfied by the following equation $$\frac{\partial n_o}{\partial t} - D \nabla^2 n_o = -k_{vo} n_o$$

where $u_1=0$ at $y=\pm b/2$;

and $u_2$ is a solution that is 0 at $x=\pm a/2$. The solution for $u_1(x,y)=X(x)Y(y)$ is obtained by a separation of variables as follows.

$$\frac{\partial \left[ \frac{\partial X}{\partial x} \right]}{X} + \frac{\partial \left[ \frac{\partial Y}{\partial y} \right]}{Y} = \lambda^2 = \lambda_x^2 - \lambda_y^2 = \frac{k}{D}$$

The sign of the sum decomposing $\lambda^2$ is chosen so that $X(x)$ and $Y(y)$ both have real values, as shown below. Since the boundary conditions on $Y(y)$ are:

$$Y(-b/2) = Y(b/2) = 0$$

the solution is, $$Y = c_y \cos \lambda_y y.$$

From the boundary conditions, $c_y = m/b$ where $m=1,3,5,\ldots$ Similarly, the solution for X is $$x = c_x \cosh \lambda_x x,$$

where $\lambda_x$ is given by $$\lambda_x = \sqrt{k_{vo}/D + (m\pi/b)^2} \, .$$

The general solution is the sum:

$$u_1 = \sum_{m}^{\infty} c_m \cosh[\sqrt{k_{vo}/D + (m\pi/b)^2} \, x] \cos \frac{m\pi y}{b},$$

where $c_m=0$ for $m=0, 2, 4, \ldots$ to satisfy the boundary conditions. Setting $u_1(a/2,y)=f(y)$, where $f(y)$ is the even-function square wave of magnitude 1, the Fourier series is obtained, $$c_m \cosh \left[ \sqrt{(k_{vo}/D + m\pi/b)^2} \, \frac{a}{2} \right] = \frac{2}{b} \int_0^b f(y) \cos \frac{m\pi y}{b} \, dy$$

and after the integration $$c_m \cosh \left[ \sqrt{(k_{vo}/D + m\pi/b)^2} \, \frac{a}{2} \right] = \frac{4}{m\pi} \sin \frac{m\pi}{2}$$

which is zero when m is even, as required. Thus, the $u_1$ part of the solution can be written $$u_1(x,y) = \sum_{m=1}^{\infty} \frac{4}{m\pi} \sin\frac{m\pi}{2} \frac{\cosh[\sqrt{k_{vo}/D + (m\pi/b)^2}\ x]}{\cosh\left[\sqrt{k_{vo}/D + (m\pi/b)^2}\ \frac{a}{2}\right]} \cos\frac{m\pi y}{b}$$

$m = 1, 3, 5, \ldots$

Note that $u_1(a/2,y)=1$ for $(-b/2<y<b/2)$. The solution for $u_2$ can be obtained in a similar way. The solution is then $$u(x,y) = \sum_{m=1}^{\infty} \frac{4}{m\pi} \sin\frac{m\pi}{2} \left\{ \frac{\cosh[\sqrt{k_{vo}/D + (m\pi/b)^2}\ x]}{\cosh\left[\sqrt{k_{vo}/D + (m\pi/b)^2}\ \frac{a}{2}\right]} \cos\frac{m\pi y}{b} + \frac{\cosh[\sqrt{k_{vo}/D + (m\pi/a)^2}\ y]}{\cosh\left[\sqrt{k_{vo}/D + (m\pi/a)^2}\ \frac{b}{2}\right]} \cos\frac{m\pi y}{a} \right\}$$

where m is odd. As $b \to \infty$, this approaches the solution for 1-dimensional diffusion (corresponding to an infinitely long strip):

$$u(x) = \frac{\cosh[\sqrt{k_{vo}/D}\ x]}{\cosh\left[\sqrt{k_{vo}/D}\ \frac{a}{2}\right]}$$

The previous two-dimensional equation is now applied to interpret ashing uniformity data and predict uniformity and the atomic oxygen concentration profile $n_o$ along the surface of a substrate for selected operating conditions. To use the relationship, values of $k_{vo}$ and D are required. For atomic oxygen diffusing through $O_2$, diffusivity was computed as $D(cm^2/s) = 0.044T^{3/2}$ (T is in K) using relations in J. O. Hirschfelder, C. F. Curtiss, R. B. Byrd, "Molecular Theory of Gases and Liquids," pp. 538–541 and 578–582, John Wiley & Sons, 2nd Printing (1963), which is hereby incorporated by reference for all purposes. Of course, other techniques for calculating the diffusivity also exist.

In general, $k_{vo}$ will be a function of at least gap, resist composition, temperature, and other parameters. In an example, $k_{vo}$ is unknown, although the activation energy for resist ashing is conventionally reported to be in the 11–12 kCal range from industry literature. However, the solutions for u(x,y) depend only on $k_{vo}/D$ and geometrical chamber dimensions such as gap (as incorporated into $k_{vo}$), a, b, and the like. Accordingly, $k_{vo}/D$ is deduced from the etching rate profile, as previously described.

In particular, $k_{vo}/D$ can be obtained from measurements of the amount of resist removed at two independent points (points where the theoretically predicted etch depth ratios $u(X_1,y_1)$, $u(X_2,y_2)$ are unequal by solving the appropriate equation for $k_{vo}/D$ and substituting for D(T,P). But the present example used a more robust procedure: determine $k_{vo}/D$ from a least squares fit to the entire experimental etch profile data set taken by a conventional stylus profilometer.

Figure 12:
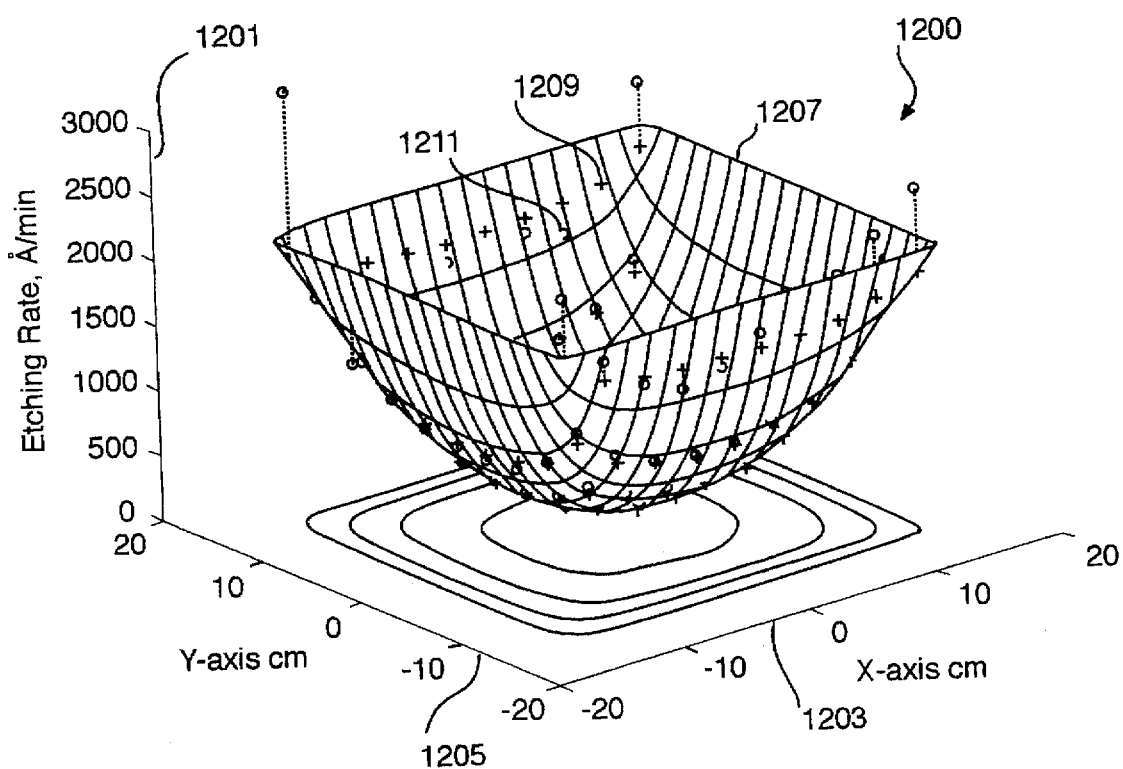

FIG. 12 shows an experimental etching profile data taken on a 30×30 cm resist-covered substrate spin-coated with 2.1 microns of MCPR 200 resist (Mitsubishi Chemical Corp., equivalent to Tokyo Ohka Kogyo Co. OFPR 800). A vertical axis 1201 defines an ashing rate $R_o$ with respect to an x-direction 1203 and a y-direction 1205. A grid pattern 1207 represents a "fitted" surface region via aforementioned equation representing ashing rates. Actual data points for each ashing rate are defined as the circular points 1211, and plots representing the fitted surface region are defined as cross points 1209. Ashing rate is greater around the periphery of the substrate, than substrate center regions.

The reactor held 1.1 mm thick substrates with a 28.9 mm gap ($d_{gap}$) above the wafer. A 4 kW rf power source sustained a plasma with pure oxygen gas flowing into the reactor at 3 liters/min. Thermocouple sensors and heaters kept the reactor chamber and substrates at T=220° C. during the etch process, and a throttle valve maintained pressure at P=1.2 Torr. Etching occurred for 5 min. Resist thickness was measured before and after etching using a Nanometrics Model 210 Nanospec Auto Film Thickness Monitor. The surface of FIG. 12 represents a least squares fit to the aforementioned equation for u(x,y) with $k_{vo}/D$ as the only adjustable parameter. The least squares fit gives $k_{vo}/D = 0.047$. At P=1.27 Torr and T=493K into $D(cm^2/s)=0.044T^{3/2}$ yields $D=400\ Cm^2/s$. By way of the relationship $k_{vo}/D = 0.047$, the etch rate constant is now $k_{vo}=19.5\ sec.^{-1}$. In the manner, e.g., by fitting profile data to the solution for given substrate geometry, $k_{vo}$ can be measured under various process conditions. By way of $k_{vo}$, other parameters such as $n_o$, $k_s$, and the like may also be calculated.

Once $k_{vo}$ is known as a function of temperature, ashing rate and uniformity can be calculated as a function of reactor size parameters (a,b) and process variables (p, T, and $n_o$). While the etching rate is proportional to $n_{oo}$, $n_{oo}$ does not affect the etch depth profile and need not be known to compute $k_{vo}$. However, after $k_{vo}$ is obtained, $n_{oo}$ can be computed from the experimentally measured etching rate per $R_{os}=k_s n_{oo}$. The procedure applies up to endpoint (endpoint is the time at which resist has been "stripped" and is no longer covering the region of the substrate where etching was fastest). At endpoint, resist begins to be cleared from the substrate so that etchable area changes. Hence, $n_{oo}$ will start to change (increase) after endpoint. The magnitude of $n_{oo}$ during the steady-state period when resist is etching controlled by the plasma source, the number of substrates loaded into the reactor and (possibly) convective loss.

Predicting Etch Rate

The effect of profile uniformity on loading can be explicitly accounted for by defining a profile-average substrate area $A_{eff}$ $$R_{os} \cdot A_{eff} = \iint A_{substr} k_{vo} n_o(x,y) dx dy = n_{oo} k_{vo} \int_{substr} u(x,y) dx dy = n_{oo} k_{vo} A_{eff}$$

so that $n_{oo} k_{vo} A_{eff}$ is the per substrate etchant consumption with nonuniformity resulting from effects of diffusion and reaction taken into account. Then for given plasma source (etchant supply), the etch rate/loading effect equation becomes:

$$\frac{1}{R_o(m)} = \frac{1}{k_s n_o} = \frac{k_r A_r + F}{k_s S^T} + \frac{m A_{eff}}{S^T}$$

All of the terms can be computed explicitly from etch rate profile data, except for the rate of etchant production by the source. The etchant production rate can be computed from two measurements of etching rate when changing $k_{vo} A_{eff}$. $A_{eff}$ can be changed either by changing the number of substrates or changing the etch rate profile (with constant etchant supply).

The present invention provides a method of selecting uniformity in chemical plasma etching as a function of processing parameters. The present invention also provides for a method of measuring absolute gas-surface reaction rates in commercial processing equipment without the benefit of sophisticated diagnostic equipment.

Gas-surface radical reaction rates are often needed for the design of plasma processing equipment and for selection of desired reaction conditions. Unfortunately, few data are available on absolute reaction rates in systems of practical interest in the prior art. Most experimental data have been taken in difficult flow tube experiments, or by related techniques which require reactant concentrations to be quantified using sophisticated methods such as gas-phase titration, laser fluorescence or mass spectrometry. These measurements require great care and specialized instrumentation. In contrast, the present invention describes a technique for measuring etching rate constants. It can be carried out in commercial processing equipment and the like, and it does not require sophisticated instrumentation, direct radical measurements, or the like. An isothermal reaction rate constant may be derived from a single measurement of etching uniformity. From this information, the etching rate uniformity as a function of substrate spacing and pressure can be computed. If experimental data on uniformity are taken at several temperatures, an intrinsic activation energy can be derived and the effects of temperature can be expressed analytically.

While the above is a full description of the specific embodiments, various modifications, alternative constructions and equivalents may be used. For example, while the description above is in terms of a plasma etching method, it would be possible to implement the present invention with other etching methods or the like.

Therefore, the above description and illustrations should not be taken as limiting the scope of the present invention which is defined by the appended claims.

What is claimed is:

1. A device fabrication method comprising the steps of:
   providing a plasma etching apparatus comprising a substrate therein, said substrate comprising a top surface and a film overlying said top surface, said film comprising a top film surface;
   etching said top film surface to define a relatively non-uniform etching profile on said film, and defining etch rate data comprising an etch rate and a spatial coordinate which defines a position within said relatively non-uniform etching profile on said substrate, said etching comprising a reaction between a gas phase etchant and said film; and
   extracting a surface reaction rate constant from said etch rate data, and using said surface reaction rate constant in the fabrication of a device.

2. The method of claim 1 wherein said etching step is diffusion limited.

3. The method of claim 1 wherein said spatial coordinate includes a radius and an angle.

4. The method of claim 1 wherein said spatial coordinate includes an x-direction and a y-direction.

5. The method of claim 1 wherein said extracting step correlates said surface reaction rate constant over a diffusivity with said etch rate, said etch rate being defined by said relatively non-uniform etching profile.

6. The method of claim 1 wherein said etch rate is defined by said relatively non-uniform etching profile at selected spatial coordinates over a time.

7. The method of claim 1 wherein said etching is an ashing method.

8. The method of claim 7 wherein said ashing method comprises reactants including an oxygen and a photoresist.

9. The method of claim 1 further comprising a step of using said reaction rate constant in adjusting said plasma etch apparatus.

10. A method of designing a reactor comprising the steps of:
    providing a first plasma etching apparatus comprising a substrate therein, said substrate comprising a top surface and a film overlying said top surface, said film comprising a top film surface;
    etching said top film surface to define a relatively non-uniform etching profile on said film, and defining etch rate data comprising an etch rate and a spatial coordinate which defines a position within said relatively non-uniform etching profile on said film of said substrate, said etching comprising a reaction between a gas phase etchant and said film; and
    extracting a surface reaction rate constant from said etch rate data, and using said surface reaction rate constant in designing a second plasma etching apparatus.

11. The method of claim 10 wherein said etching step at a postion on said relatively non-uniform etching profile is diffusion limited.

12. The method of claim 10 wherein said spatial coordinate which defines said position along said relatively non-uniform etching profile includes a radius and an angle.

13. The method of claim 10 wherein said spatial coordinate which defines said position within said relatively non-uniform etching profile includes an x-direction and a y-direction.

14. The method of claim 8 wherein said extracting step correlates said surface reaction rate constant over a diffusivity with said etch rate, said etch rate being defined by said relatively non-uniform etching profile.

15. The method of claim 10 wherein said etch rate is defined by said relatively non-uniform etching profile at selected spatial coordinates over a time.

16. The method of claim 10 wherein said etching is an ashing method.

17. The method of claim 16 wherein said ashing method comprises reactants including an oxygen and a photoresist.

18. The method of claim 10 wherein said second plasma etching apparatus is a co-axial reactor.

19. The method of claim 10 wherein said second plasma etching apparatus is a plasma etching apparatus.

20. A substrate fabrication method, using a plasma etching apparatus, said method comprising:
    providing a substrate selected from a group consisting of a semiconductor wafer, a plate, and a flat panel display, said substrate comprising a top surface;
    forming a film overlying said top surface, said film comprising a top film surface;
    etching said top film surface to define a relatively non-uniform profile on said film, and defining etch rate data comprising an etch rate and a spatial coordinate which defines a position within said relatively non-uniform etching profile of said film on said substrate, said etching comprising a reaction between a gas phase etchant and said film; and
    extracting a surface reaction rate constant from said etch rate data, and using said surface reaction rate constant.

21. The method of claims 1, 10, or 20 wherein said etching is provided whereupon chemical effects are enhanced over ion bombardment effects.

22. A method of fabricating an integrated circuit device, using a plasma etching apparatus, said method comprising:
    providing a uniformity value and a surface reaction rate constant for an etching reaction, said etching reaction including a substrate and etchant species;

defining etching parameters providing said uniformity value; and adjusting at least one of said etching parameters using said surface reaction rate constant to produce a selected etching rate;

wherein said etching rate providing an etching condition for fabrication of an integrated circuit device.

23. The method of claim 22 wherein said etching parameters can be selected from a group consisting of a temperature, a pressure, a power, a gap, and a flow rate.

24. The method of claim 22 wherein said uniformity value ranges from 90% and greater.

25. The method of claim 22 wherein said uniformity value ranges from 95% and greater.

26. A process for fabricating a device using a plasma etching apparatus, said device being fabricated by use of a surface reaction rate constant, said surface reaction rate constant being derived from a method comprising:

providing a plasma etching apparatus comprising a substrate therein, said substrate comprising a top surface and a film overlying said top surface, said film comprising a top film surface;

etching said top surface at a temperature to define a relatively non-uniform etching profile on said film, and defining etch rate data comprising an etch rate and a spatial coordinate which defined a position from said relatively non-uniform etching profile on said film of said substrate, said etching comprising a reaction between a gas phase etchant and said film; and extracting from said etching rate data a surface reaction rate constant for said temperature.

27. The process of claim 26 wherein said surface reaction rate constant is derived using at least a diffusivity value that is determined by an equation.

28. The process of claim 26 wherein said etching is provided whereupon chemical effects are enhanced over ion bombardment effects.

29. The method of claim 26 further comprising using said surface reaction rate constant in a method selected from a group consisting of a fabrication of a device or of designing a reactor, said surface reaction rate constant being provided by at least a diffusivity value.

* * * * *